United States Patent [19]

Grieves et al.

[11] 4,196,792

[45] Apr. 8, 1980

[54] LAMINAR FLOW VENTED SPEAKER ENCLOSURE

[76] Inventors: J. Philip Grieves, 1621 N. Raymond Ave., Fullerton, Calif. 92631; Mark F. Merlino, 12211 Ferrari La., Garden Grove, Calif. 92641

[21] Appl. No.: 959,355

[22] Filed: Nov. 9, 1978

[51] Int. Cl.[2] .................................... H05K 5/00

[52] U.S. Cl. .................................... 181/156; 181/199

[58] Field of Search .................................... 181/148-156, 181/198, 199, 175, 144-147; 179/1 E

[56] References Cited

U.S. PATENT DOCUMENTS

| | | | |
|---|---|---|---|
| 2,834,423 | 5/1958 | Bradford | 181/156 |
| 3,371,742 | 3/1968 | Norton et al. | 181/153 |
| 3,529,691 | 9/1970 | Wesemann | 181/156 |
| 3,722,616 | 3/1973 | Beavers | 181/156 |
| 4,119,799 | 10/1978 | Merlino | 181/144 |

FOREIGN PATENT DOCUMENTS

| | | | |
|---|---|---|---|
| 2509369 | 10/1976 | Fed. Rep. of Germany | 181/156 |

*Primary Examiner*—L. T. Hix

*Assistant Examiner*—Benjamin R. Fuller

*Attorney, Agent, or Firm*—George W. Finch

[57] ABSTRACT

A vent for linear control of pressure in an infinite baffle type loudspeaker system wherein an elongated "V" shaped trough is cut through the back wall of a speaker enclosure with the smaller side of the trough piercing the inner surface of the back wall of the enclosure and the larger side thereof piercing the outer surface thereof. Outside the outer wall, the trough is covered by a dispersion structure including a plurality of transverse plates generally at right angles thereto whose back edges are covered so that air flow into and out of the cabinet must pass through channels formed by the back wall of the enclosure, the plates and the cover.

10 Claims, 4 Drawing Figures

FIG. 1
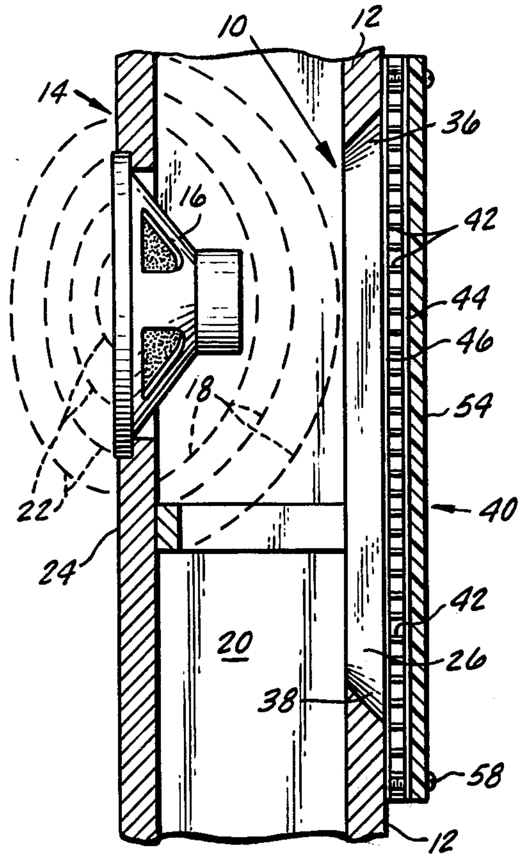
FIG. 2
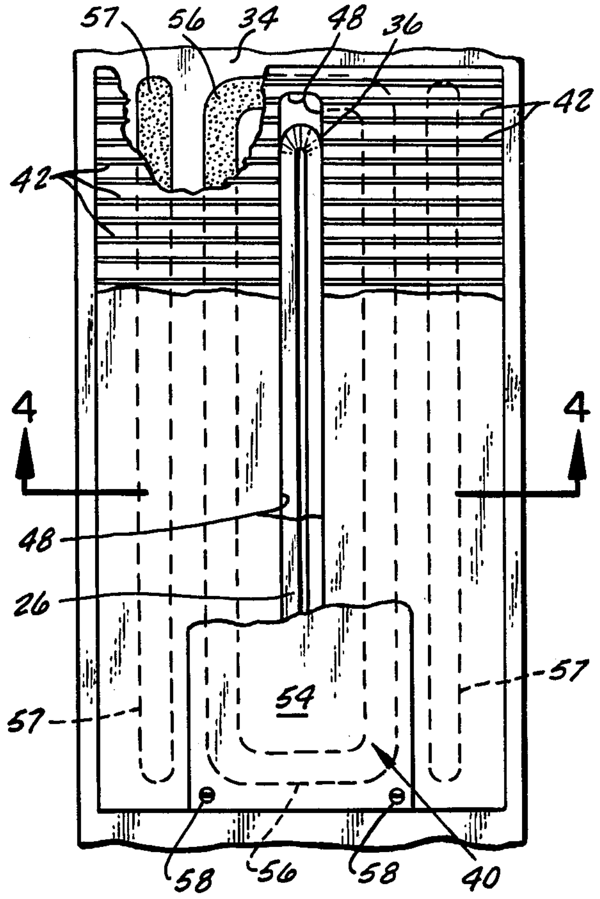
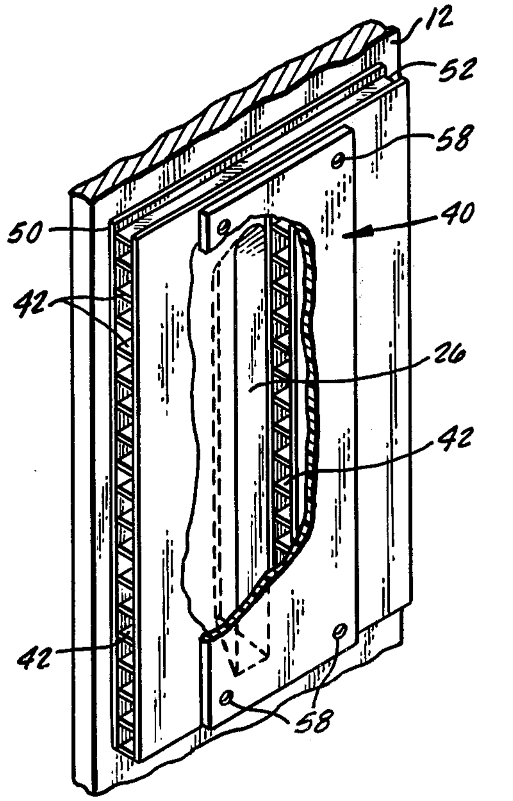
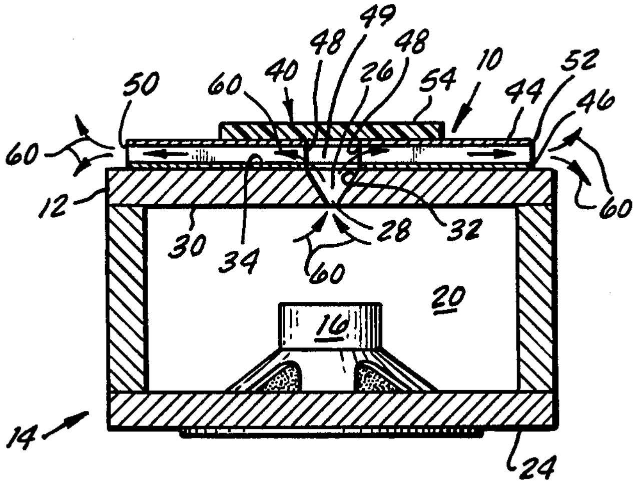
FIG. 4

LAMINAR FLOW VENTED SPEAKER ENCLOSURE

BACKGROUND OF THE INVENTION

A conventional electro-mechanical speaker requires a cabinet to absorb the back waves from the speaker to prevent them from cancelling with the front waves projecting off of the front of the speaker. In order to produce a wide frequency range, the cabinet must be large enough so that it is not appreciably pressurized as the driver speaker is producing low frequency tones since to do so restricts the driver cone which must move substantial distances to produce the low frequencies. Formulae have been developed to determine the size of the cabinet for the required low frequency response. To simulate live music and its related effects, such as pressure and ambiance, audiable output well below 40 Hz is desirable. Unfortunately, to produce this type of sound, the cabinet must be very large to prevent pressurization and the distortion it can cause.

The prior art relies on several devices to enable the production of low frequency response in reasonably sized cabinets. Probably the most popular are linear pressure relief systems which are known in the trade as Ventri ports or micro ports. It is believed they were developed by John Iverson in the 1960's as "acoustic diodes". An acoustic diode essentially is nothing more than a tapered hole. Air can pass from the smaller end to the larger end of the hole faster than it can pass in the other direction due to the flow characteristics thereof. Such ports allow a great reduction in cabinet size without loss of important low frequency reproduction. There are, however, restrictions on how small the cabinet can be because as the cabinet decreases in volume, an increase in pressure results which eventually causes the ports to whistle. The frequency of this whistle is higher than the fundamental tone, so if the sound level is high enough, the whistling interferes with the low frequency response of the system. Increasing the number of ports does not reduce the pressure sufficiently to stop the whistling. This would seem to indicate that there is a minumum size for a cabinet even if it has a linear venting system. Such a venting system is shown in U.S. Pat. No. 4,119,799 entitled "Critical Alignment Loudspeaker System" by Mark Merlino, a co-inventor hereof. The application shows such ports included in an infinite baffle type speaker system. This type of venting system shoud not be confused with tuned port systems. They allow the back wave to exit the cabinet in phase with the front wave. In most conventional bass reflex speaker systems this gives the effect of low energy by boosting the level around 50 Hz. Extended response below 40 Hz is impossible with this type of system without the added features shown in the referenced application.

Transmission lines and passive pistons can actually increase the low frequency response of a speaker system but control of such complex devices becomes a problem due to inertia, and such system never truly can be linear. Electronic equalization can tailor the low frequency response of the system, but with an increase in noise and distortion due to longer signal path.

BRIEF DESCRIPTION OF THE PRESENT EMBODIMENT

The present invention includes a "V" slot preferably oriented vertically along the back wall of a speaker cabinet and oriented through the back wall in the same direction as the tapered holes of Iverson. The "V" slot operates as a linear pressure release. In small cabinets, sufficient pressure can build up and the "V" slot by itself will whistle like the tapered holes when low frequencies are being produced. Therefore, a dispersion structure is placed over the slot to slow the air down and disperse it so that the noise of the port will not interfere with the fundamental tone. In the present invention, the dispersion structure includes a plurality of sidewardly extending baffles which surround the outlet of the "V" slot and force a 90° bend in the air flowing therethrough. The dispersion structure lays flat against the back of the speaker cabinet so that it does not appreciably enlarge the overall volume required by the cabinet, yet it provides a tremendous volume to dissipate the air passing through the "V" slot and thereby prevents the whistling. When the dispersion structure is constructed from corrugated polypropolene and ABS plastic sheet, it is relatively economical to manufacture and install and therefore can be added without increasing the cost of the overall speaker enclosure appreciably.

It is therefore an object of the present invention to provide means to efficiently vent a speaker enclosure so that low frequency sounds can be produced therein.

Another object is to provide means which allow the production of low frequencies in a speaker enclosure without resort to complex electronic or mechanical systems.

Another object is to provide an improvement to Iverson linear vent systems.

Another object is to provide relatively economic and easy to produce means for preventing whistling of linear pressure reliefs.

These and other objects and advantages of the present invention will become apparent to those skilled in the art after considering the following detailed specification which covers a preferred embodiment thereof in conjunction with the accompanying drawing wherein:

BRIEF DESCRIPTION OF THE DRAWING

FIG. 1 is a side cross-sectional view through a speaker enclosure constructed according to the present invention;

FIG. 2 is a back elevational view partially cut away to show the details of the present invention;

FIG. 3 is a perspective view of the present invention partially cut away; and

FIG. 4 is a cross-sectional view taken at line 4—4 in FIG. 2.

DETAILED DESCRIPTION OF THE SHOWN EMBODIMENT

Referring to the drawing, more particularly by reference numbers, number 10 in FIG. 1 refers to a laminar flow vent constructed according to the present invention. The vent 10 is shown installed in the back wall 12 of a speaker enclosure 14 which is shown as the infinite baffle type. The speaker enclosure 14 includes a speaker 16 which when excited at low frequencies would produce back waves 18 which normally would tend to pressurize the interior volume 20 of the enclosure 14 and interfere with the ability of the speaker 16 to produce the desired sound waves 22 out of the front 24 of the cabinet 14 since the enclosure 14, without the vent 10, fully encloses the rear of the speaker 16.

The vent 10 includes a "V" shaped slot 26 which runs longitudinally down the back 12 of the enclosure 14. The "V" shaped slot 26 has a smaller side 28 which pierces the inner surface 30 of the back 12 and a larger side 32 which pierces the outer surface 34 of the back. 16 to 1 has been found to be a suitable ratio for the relative sizes of the sides 32 and 28 when a ¾ inch thick back wall 12 is provided. The upper and lower ends 36 and 28 respectively of the slot 26 are frustroconical in shape to smoothly complete the configuration of the "V" slot 26. The "V" slot 26 is easily constructed in a conventional cabinet by means of a frustroconical router set to the proper depth and having the proper cutter angle formed thereon.

The "V" shaped slot 26 acts like the ports of the aforementioned acoustic diode but can pass considerably more air therethrough to prevent pressurization of the cabinet 14. However, this must be controlled or a whistle will result. Therefore, a dispersion structure 40 is positioned thereover. As shown, the dispersion structure 40 includes a plurality of spaced horizontally oriented plates 42 which are positioned between two parallel sheets 44 and 46, sheet 46 being in contact with the outer surface 34 of the back 12, while sheet 46 forms a portion of the back surface of the dispersion structure 40. Standard corrugated stock is available with ¼ inch wide plates 42 on ½ centers. Of course other sizes can be matched to the overall size of the enclosure and the air moving capacity of the enclosed speakers. The sheet 46 has a cutout 48 therein positioned to match the "V" shaped slot 26 and the baffle plates 42 and the area adjacent thereto is cut away to form a plenum 49. The outer sheet 44 may extend substantially from one end 50 of the baffle plates 42 to the other 52 or the cutout 48 may extend through both sheets 44 and 46. This latter construction allows easier fabrication of the plenum 49 and in which case the plenum 49 is covered by means such as a piece of ABS plastic sheet 54 fastened thereover.

One or more beads 56 and 57 of adhesive gasket material such as silicone rubber are placed on the outer surface 34 of the back 12 before the inner sheet 46 of the dispersion structure 40 is attached thereto. It is preferable that at least one of the beads 56 extend completely around the "V" shaped slot 26 to assure that a seal is present and to prevent mechanical rattling of the dispersion structure 40. The structure 40 is then further secured to the back 12 by suitable means such as the screws 58 shown.

Once the vent 10 is in position, back waves 18 which otherwise would tend to pressurize the volume 20, can pass out of the cabinet 14 in the direction shown by the arrows 60 so that interior volume pressurization and degraduation of the low frequency sound production capability of the speaker 16 does not occur. At the same time, no whistling effect is created. Although the sheets 44 and 46 are shown as parallel structures, in some instances they may be other than parallel such as being formed with exponential spacing with larger openings facing in the direction of the arrow 60 to assure laminar flow through the passageways and to prevent the aforesaid whistling. This, of course, would require a molded vent plate assembly and would be more expensive than the shown embodiment which can be constructed from standard stock.

Thus, there has been shown and described a novel laminar flow vent for loudspeaker enclosures which fulfills all the objects and advantages sought therefor. Many changes, modifications, variations and other uses and applications of the subject invention will, however, become apparent to those skilled in the art after considering the aforegoing specification together with the accompanying drawing and claims. All such changes, modifications, variations and other uses and applications which do not depart from the spirit and scope of the invention are deemed to be covered by the invention which is limited only by the claims that follow.

What is claimed is:

1. A speaker enclosure having back, side, front, top, and bottom walls, and a vent positioned in said back wall, said vent including sloping side wall surfaces formed in said back wall so that said sloping side wall surfaces are closer together at the portions thereof that are closer to said front wall than the portions thereof which are further from said front wall, and dispersion means positioned on said back wall adjacent said sloping walls.

2. The speaker enclosure defined in claim 1 wherein said back wall includes an inner surface and an outer surface, said sloping side wall surfaces defining an elongated "V" shaped trough whose smaller end pierces said inner surface of said back wall and whose larger end pierces said outer surface of said back wall.

3. The speaker enclosure defined in claim 2 wherein said V shaped trough has frustro-conic shaped ends.

4. The speaker enclosure defined in claim 3 wherein said V shaped trough defines an inner opening and an outer opening in said inner and outer surfaces of said back wall, the relative ratio of said openings being about 1:16.

5. The speaker enclosure defined in claim 1 wherein said dispersion means include a plurality of passageways each having an inner end and an outer end, said inner end of each passageway being positioned adjacent to said vent whereby air passing through said vent tends to pass through said passageways.

6. The speaker enclosure defined in claim 5 wherein said passageways are parallel to said back wall.

7. The speaker enclosure defined in claim 6 wherein said passageways are positioned on opposite sides of said vent and wherein a plenum is formed over said vent and adjacent said passageways.

8. The speaker enclosure defined in claim 7 wherein said dispersion means are formed from a cover plate and a sheet of corrugated material with a portion of the material removed to form a portion of said plenum, said portion of removed material being covered by said cover plate so that said plenum is formed over said vent.

9. The speaker enclosure defined in claim 6 wherein said passageways are parallel to said bottom wall.

10. The speaker enclosure defined in claim 8 wherein said dispersion means are attached to said back wall by means of adhesive having anti-rattling and sealing properties and mechanical fasteners.

* * * * *